United States Patent
Craig

(10) Patent No.: US 9,276,546 B2
(45) Date of Patent: Mar. 1, 2016

(54) ELECTROMAGNETIC INTERFERENCE FILTER ASSEMBLY

(71) Applicant: TYCO ELECTRONICS CORPORATION, Berwyn, PA (US)

(72) Inventor: Evan Lawrence Craig, Vernon Hills, IL (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 0 days.

(21) Appl. No.: 14/186,144

(22) Filed: Feb. 21, 2014

(65) Prior Publication Data

US 2015/0244339 A1 Aug. 27, 2015

(51) Int. Cl.
| H03H 1/00 | (2006.01) |
| H01F 17/06 | (2006.01) |
| H03H 7/01 | (2006.01) |
| H03H 7/42 | (2006.01) |
| H01F 27/26 | (2006.01) |

(52) U.S. Cl.
CPC ........... *H03H 1/0007* (2013.01); *H03H 7/0115* (2013.01); *H03H 7/427* (2013.01); *H01F 27/26* (2013.01); *H01F 2017/065* (2013.01); *H01F 2017/067* (2013.01); *H03H 2001/005* (2013.01); *H03H 2001/0028* (2013.01); *H03H 2001/0057* (2013.01)

(58) Field of Classification Search
CPC ..... H03H 1/00; H03H 1/0007; H03H 7/0115; H03H 7/427; H03H 2001/005; H03H 2001/0028; H03H 2001/0057; H01F 27/26; H01F 2017/065; H01F 2017/0657
USPC ........................................... 333/181–185, 12
See application file for complete search history.

(56) References Cited

U.S. PATENT DOCUMENTS

| 4,737,745 A | 4/1988 | Doepker |
| 5,083,101 A | 1/1992 | Frederick |
| 5,119,266 A | 6/1992 | Petry |
| 5,195,232 A | 3/1993 | Frederick |
| 5,838,216 A * | 11/1998 | White et al. .................. 333/182 |
| 6,055,164 A | 4/2000 | Chen et al. |
| 6,218,913 B1 | 4/2001 | Pagenkopf |
| 8,134,845 B2 | 3/2012 | Cheng |
| 2004/0051600 A1 | 3/2004 | Begon et al. |
| 2010/0181876 A1 | 7/2010 | Watanabe et al. |

FOREIGN PATENT DOCUMENTS

DE 10 2005 013509 A1 10/2005

OTHER PUBLICATIONS

"High-Current Three-Phase EMC/RFI Filter", Schaffner, Three-Phase Filters FN 3359, Jan. 2014, 4 pgs.
European Search Report, Mail Date Jul. 24, 2015, EP 15 15 5525, Application No. 15155525.7-1810.

* cited by examiner

*Primary Examiner* — Benny Lee
*Assistant Examiner* — Albens Dieujuste

(57) ABSTRACT

An assembly and method for providing electromagnetic interference isolation. The assembly includes an enclosure which has a first panel and a second panel. Bus bars extend through the first panel and the second panel. A mounting plate is positioned between the first panel and the second panel. The mounting plate has locating members thereon. A plurality of inductive cores are positioned proximate the locating members, the inductive cores having openings through which the bus bars extend. The inductive cores are precisely positioned in the enclosure to facilitate the electromagnetic interference isolation.

18 Claims, 5 Drawing Sheets

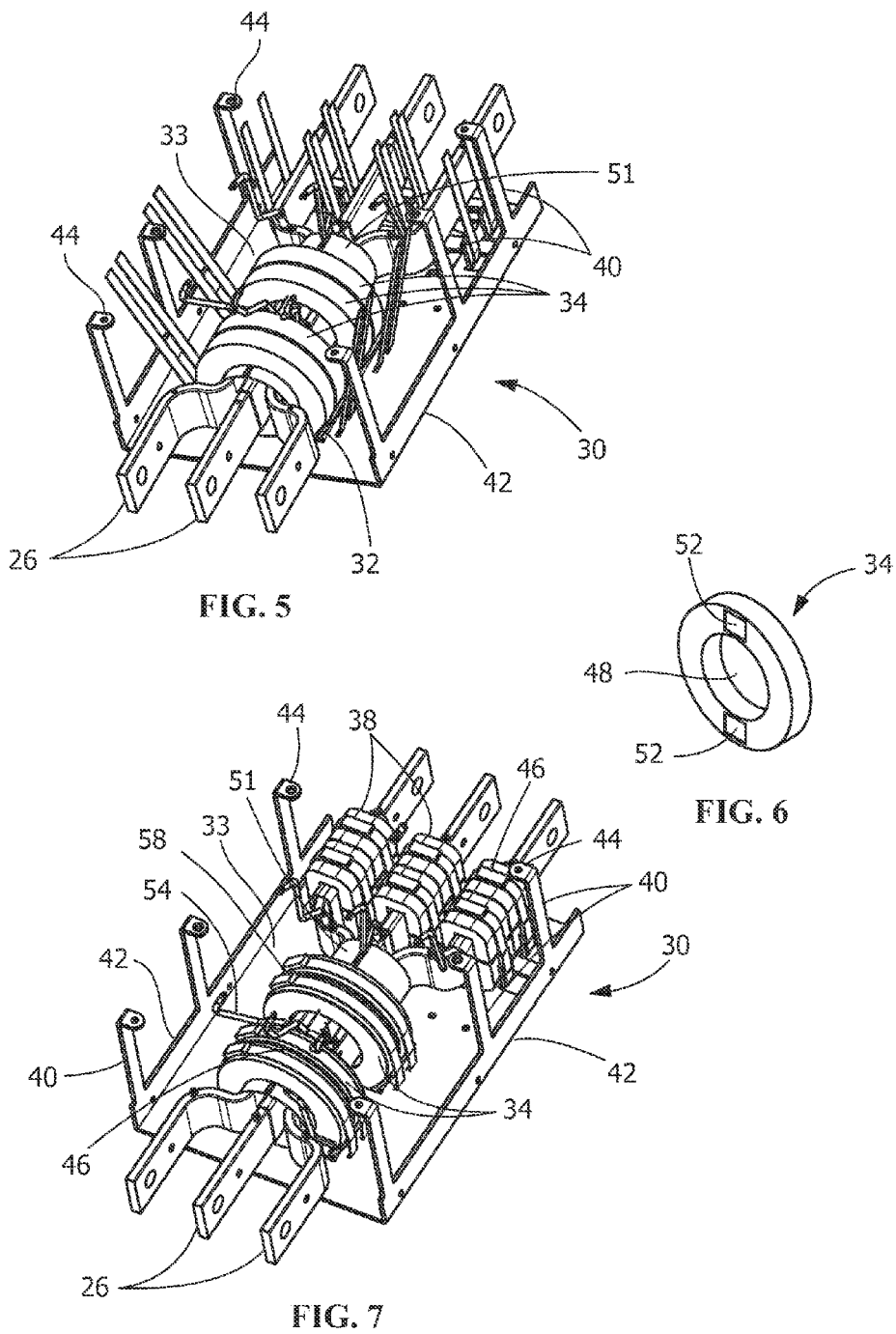

ELECTROMAGNETIC INTERFERENCE FILTER ASSEMBLY

FIELD OF THE INVENTION

The present invention relates to electric components and assemblies and more particularly, to components, assemblies and methods for providing power line filters.

BACKGROUND OF THE INVENTION

Electronic equipment employing digital techniques, such as computing devices, and other electronic or electrical equipment, such as switching power supplies, cause electromagnetic interference (EMI) which can both be radiated and conducted. Designers and users of such equipment must be concerned with suppression of conducted EMI or noise because the noise can interfere with proper operation of other equipment which could be necessary to health and safety. Furthermore the U.S. Federal Communications Commission (FCC) and others have established regulations and standards regarding EMI emissions.

It is known to place a power line interference filter between the power source and the equipment causing the EMI. One such filter which has been used on power systems includes a plurality of generally cylindrical capacitors arranged in a generally rectangular array. Several ferrite inductive cores are mounted on one side of the array and feed through bus bars are passed through these inductors. Capacitor bus bars are connected to terminals at one end of each capacitor and are typically brazed to the feed through conductors. Terminals extending from the other ends of the capacitors are shorted by a shorting plate.

Another such filter is shown in U.S. Pat. No. 4,737,745 which describes an electromagnetic interference filter assembly having a pair of magnetic cores each having a central opening. The cores are mounted with their openings aligned along a common axis and feed through conductors pass through the openings. Two arrays of capacitors are mounted on opposite sides of the cores and capacitor bus bars serve to electrically connect corresponding ones of these capacitors in each array. A portion of each capacitor bus bar includes an aperture which is aligned along the common axis and through bolts which lie along the common axis which are used to hold the feed through conductors and capacitor bus bars in electrical contact with each other.

In many known filters, the magnetic cores and other electronic components are maintained in position by a potting material. This makes the precise positioning of the components difficult as the potting material is first introduced to the assembly as a liquid and must harden. Consequently, additional mechanical devices must be employed during manufacture to maintain the positioning of the components as the potting material solidifies. In addition, as the potting material solidifies, stresses may be introduced to the magnetic cores, causing magnetostriction, thereby reducing the effectiveness of the filter.

Although such known filter assemblies generally perform their intended function, it is desirable to provide an EMI filter assembly in which the electrical components are precisely located and stresses on the electrical components are reduced or controlled. In addition, it is desirable to provide filters which are smaller in size and which are easier to assemble than the filters known in the art.

SUMMARY OF THE INVENTION

It is an object of this invention to obviate the above-described problems.

It is another object of this invention to provide a system and method for providing EMI isolation in which the inductive/magnetic cores are precisely located.

It is another object of this invention to provide a system and method for providing EMI isolation in which the capacitors are precisely located on a circuit board.

It is another object of this invention to provide a system and method for providing EMI isolation in which the magnetic cores are maintain in position without magnetostriction.

It is another object of this invention to provide a system and method for providing EMI isolation in which the circuit board with the capacitors is directly connected to a conductive enclosure to enhance the EMI shielding.

An embodiment is directed to an assembly for providing electromagnetic interference isolation. The assembly includes an enclosure which has a first panel and a second panel. Bus bars extend through the first panel and the second panel. A mounting plate is positioned between the first panel and the second panel. The mounting plate has locating members thereon. A plurality of inductive cores are positioned proximate the locating members, the inductive cores having openings through which the bus bars extend. The inductive cores are precisely positioned in the enclosure to facilitate electrical isolation.

An embodiment is directed to an assembly for providing electromagnetic interference isolation. The assembly includes an enclosure which has a first panel and a second panel. Bus bars extend through the first panel and the second panel. A mounting plate is positioned between the first panel and the second panel. The mounting plate has locating members thereon. A plurality of inductive cores are positioned proximate the locating members, the inductive cores having openings through which the bus bars extend. Capacitors are mounted on a circuit board. The inductive cores and the capacitors are precisely positioned in the enclosure to facilitate electrical isolation.

An embodiment is directed to a method of providing electrical isolation in an electromagnetic interference filter. The method includes: providing an enclosure assembly; providing locating members on a mounting plate housed in the enclosure assembly; precisely locating inductive cores on the mounting plate; and securing the inductive cores on the mounting plate. The inductive cores are precisely positioned in the enclosure to facilitate the electrical isolation.

An embodiment is directed to a method of providing electrical isolation in an electromagnetic interference filter. The method includes: providing an enclosure assembly; providing locating members on a mounting plate housed in the enclosure assembly; precisely locating inductive cores on the mounting plate; securing the inductive cores on the mounting plate; providing a circuit board; mounting capacitors on the circuit board; and electrically connecting conductive members between the circuit board and bus bars which extend through an opening of the inductive cores. The inductive cores are precisely positioned in the enclosure to facilitate the electrical isolation.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 5 is a perspective view of the plate of FIG. 4 with the inductive cores and bus bars positioned on the plate.

FIG. 6 is a perspective view of a respective inductive core of FIG. 5.

FIG. 7 is a perspective view of the plate of FIG. 5 with the inductive cores and the bus bars secured to the plate by the hold down members.

Wherever possible, the same reference numbers will be used throughout the drawings to refer to the same or like parts.

DETAILED DESCRIPTION OF THE INVENTION

Figure 1:
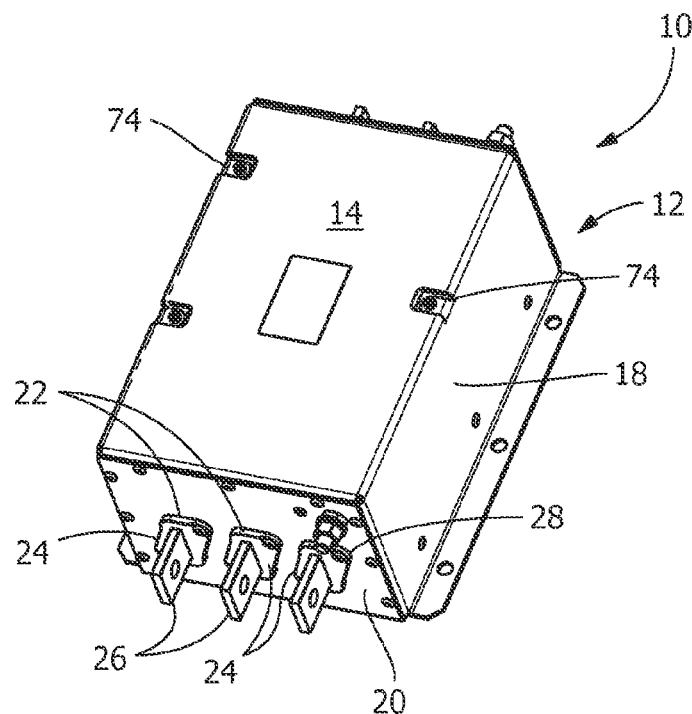
FIG. 1 is a top perspective view of an illustrative filter assembly according to the present invention.

The present invention will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that spatially relative terms, such as "top", "upper", "lower" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "over" other elements or features would then be oriented "under" the other elements or features. Thus, the exemplary term "over" can encompass both an orientation of over and under. The device may be otherwise oriented (rotated 90 degrees or at other orientations) and the spatially relative descriptors used herein interpreted accordingly.

The present invention is directed to a filter assembly in which the electrical components are precisely located and stresses on the electrical components are reduced or eliminated, thereby allowing the filters to be effective in filtering unwanted noise. In addition, the assembly can be smaller in size and easier to assemble than the filters known in the art. The inductive/magnetic cores of the assembly are precisely located and are maintained in position without magnetostriction. In addition, the capacitors are precisely located on a circuit board and the circuit board is directly connected to a conductive enclosure to enhance the EMI attenuation.

Figure 2:
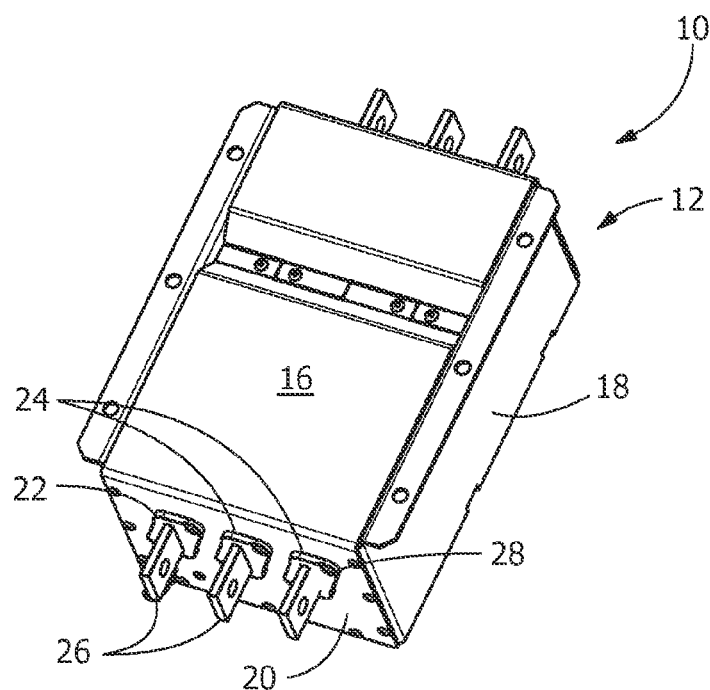
FIG. 2 is a bottom perspective view of the filter assembly of FIG. 1.

Referring to FIGS. 1 and 2, an illustrative filter assembly 10 is illustrated. In the embodiment shown, the assembly 10 has a conductive enclosure 12 which surrounds and encloses electrical components therein. The enclosure 12 has a top wall 14, a bottom wall 16 and side walls 18 which extend between the top wall 14 and the bottom wall 16. A front wall or first mounting panel 20 and a back wall or second mounting panel (not shown) extend between the top wall 14 and the bottom wall 16. The front and back mounting panels also extend between the side walls 18. The conductive enclosure 12 is made from electrically conductive material to provide shielding to the electrical components used in the assembly 10.

Bus bar-receiving openings 22 extend through the front wall 20. In the illustrative embodiment shown, three openings 22 are shown, but any number can be provided without departing from the scope of the invention. The openings 22 are dimensioned to receive insulators 24 and bus bars 26 therethrough. In the illustrative embodiment shown, fastener receiving openings 28 are offset from the geometrical centerline of the bus bar 26, however other configurations can be used without departing from the scope of the invention. A more detailed description of the illustrative insulators and supporting components which provide proper electrical isolation of the bus bars 26 from the conductive enclosure 12 can be found in co-pending U.S. patent application Ser. No. 13/742,399 filed Jan. 16, 2013, which is hereby incorporated by reference in its entirety.

Figure 3:
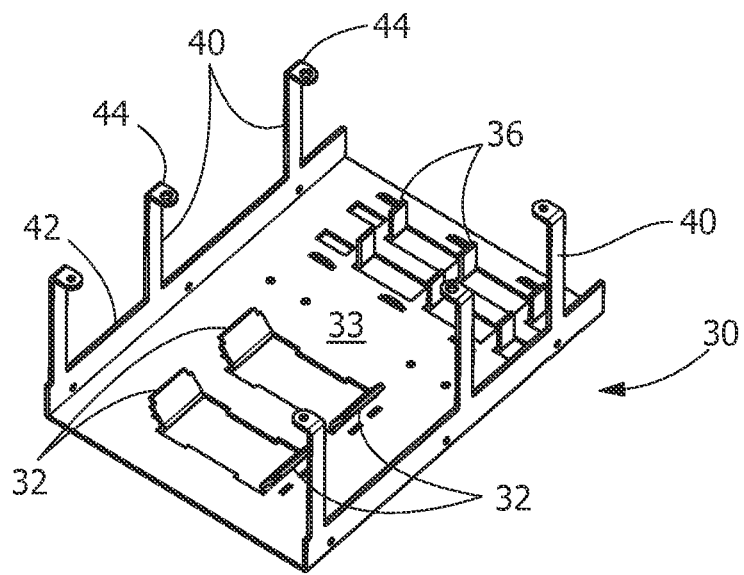
FIG. 3 is a perspective view of a plate used in the filter assembly of FIG. 1, the plate having projections extending therefrom to cooperate with the inductive cores of the assembly.

Referring to FIG. 3, a mounting plate 30 is provided in the conductive enclosure 12 between the two side walls 18. The mounting plate 30 has locating members or tabs 32 which are formed from a top surface 33 of the mounting plate 30. The tabs 32 extend from the top surface 33 at an acute angle which is less than 90 degrees, such as, but not limited to less than 60 degrees, less than 50 degrees, less than 40 degrees, greater than 10 degrees, greater than 20 degrees, approximately 20 degrees, approximately 30 degrees, approximately 40 degrees or any other angle in which two respective tabs 32 form a cradle to cooperate with inductive cores 34, as will be more fully described.

Tabs 36 also extend from the top surface 33 of the mounting plate 30 at an angle which is approximately equal to 90 degrees or any other angle in which two respective tabs 36 form mounting guides to cooperate with cores 38, as will be more fully described.

Mounting legs 40 extend from a sidewall 42 of the mounting plate 30. The sidewalls 42 extend from the top surface 33 in an essentially perpendicular direction. In the embodiment shown, the sidewalls 42 are integral with and are formed from the top surface 33. In the embodiment shown, three mounting legs 40 extend from each sidewall 42, although other numbers of mounting legs 40 can be used without departing from the scope of the invention. Circuit board mounting tabs 44 are provided at the ends of mounting legs 40.

Figure 4:
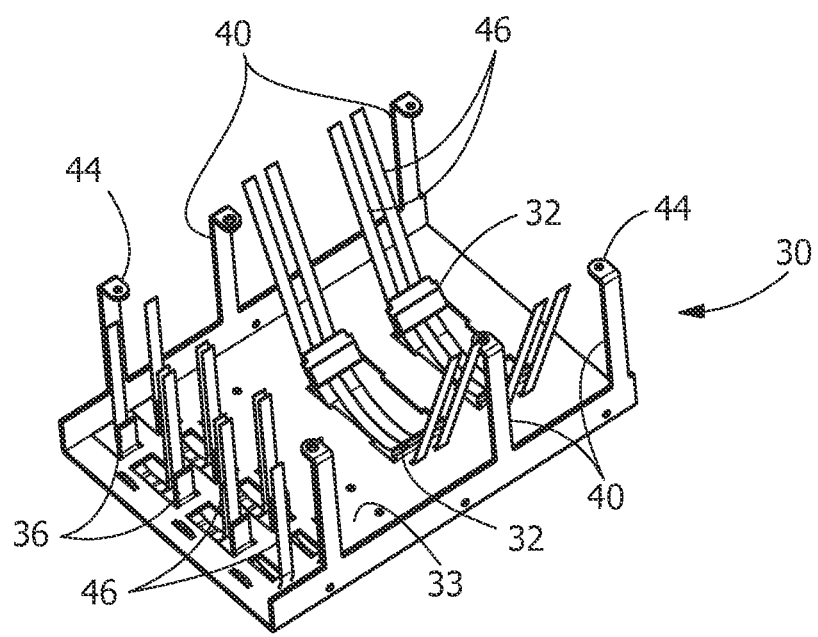
FIG. 4 is a perspective view of the plate of FIG. 3 with hold down members positioned thereon.

Referring to FIG. 4, with the mounting plate 30 properly formed, securing bands 46 are inserted proximate tabs 32, 36. The securing bands 46 are inserted through openings created when the tabs 32, 36 are formed from the top surface 33. The bands 46 are made from any material which has a sufficient melt/relaxation temperature to maintain the stiffness characteristics required. Such melt/relaxation temperature being greater than the maximum capacitor temperature, which in the embodiment shown is 110 degrees Celsius or the ferrite curie temperature, which in the embodiment shown is 140 degrees Celsius. Such material includes, but is not limited to pallet packing steel tape, bailing wire, other metal tape, and other metal wire.

Figure 8:
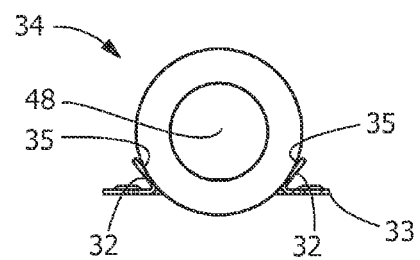
FIG. 8 is a cross-sectional view taken along line 8-8 of FIG. 7, showing a respective conductive core in a position relative to the respective hold down members.

Referring to FIG. 5, with the top surface 33 properly formed, the inductive cores 34 are positioned proximate the respective tabs 32 (as best shown in FIG. 8). Padding 35 may be provided on the tabs 32. The padding 35 is made from any material which has a sufficient cushioning and which can withstand temperatures being greater than the maximum capacitor temperature, which in the embodiment shown is 110 degrees Celsius or the ferrite curie temperature, which in the embodiment shown is 140 degrees Celsius.

In the embodiment shown, the inductive cores 34 are magnetic cores, which may be of a high frequency ferrite composition. Each of these cores 34 includes a central opening 48. The openings 48 are aligned along a common axis. The bus bars 26 extend through the openings 48 as shown. Insulation 51 serves to electrically insulate the bus bars 26 from the cores 34. In the illustrative embodiment, four cores 34 are shown, with two respective cores 34 being positioned adjacent each other. The adjacent cores 34 being spaced apart by foam tape 52 (FIG. 6). In the illustrative embodiment, the openings 48 are circular and receive three bus bars 26. However, other configurations of the openings 48 and other numbers of bus bars 26 can be used without departing from the scope of the invention.

At least one wire 54 is secured to each of the bus bars 26. Each wire 54 has a terminal which is secured to a respective bus bar 26 by means of a screw. The screw compresses the terminal against the bus bar 26 thereby providing good electrical contact there between. Other known means of securing the wires 54 to the bus bars 26 can be used without departing from the scope of the invention.

Inductive cores 38 are also positioned to cooperate with each of the bus bars 26. The cores 38 may be made from materials such as, but not limited to, silicon or powdered iron. The tabs 36 cooperate with the cores 38 to properly position the cores 38 and facilitate electrical isolation between the cores 38 and the bus bars 26.

With the cores 34 properly positioned proximate to and in alignment with respective tabs 32, and the cores 38 proximate to and aligned with tabs 36, the bands 46 are deformed and tightened around the cores 34 and the cores 38 to form retention hoops. With respect to the cores 34, due to the acute angle of the tabs 32 and the stiffness of the bands 46, the bands 46 bend as they are tightened. A tightening tool (not shown) cooperates with a fastener 58 to constrict the bands 46 around the cores 34. The bands 46 are tightened until the hoops provide sufficient force to hold the cores 34 in position relative to the tabs 32 and the top surface 33, i.e. in the cradles. However, the tightening of the bands 46 is stopped prior to the bands 46 causing the deflection of the tabs 32 or just after the tabs 32 are deflected toward the cores 34. The controlled tightening prevents or limits the deformation of the bands 46 by the tabs 32 and causes the tabs 32 of the cradle to be deflected toward the cores 34, which in turn prevents the deformation of the cores 34 while properly maintain the inductive cores 34 in position in the cradles, thereby minimizing or eliminating magnetostriction of the cores 34. Consequently, the configuration of the cradle, i.e. the tabs 32 and the top surface 33, provides a visual and mechanical indication of the maximum tension to be applied to the bands 46, thereby establishing an appropriate hoop tension limit. The use of padding 35, while not required, can further protect the cores 34 from damage, eliminating or minimizing hertzian contact stresses between the cores 34 and the tabs 32.

As the tabs 32 are precisely located on the top surface 33 of the mounting plate 30, the positioning of the cores 34 adjacent to the tabs 32 causes the cores 34 to be precisely positioned relative to the mounting plate 30 and the enclosure 12. Stated differently, pairs of tabs 32 form cradles which receive cores 34 therein. Each core 34 mechanically engages each tab 32 of the pair of tabs and the top surface 33 of the mounting plate 30. This mechanical engagement provides sufficient mechanical contact to properly position each core 34 in a respective cradle, such that the opening 48 of each core 34 will align with the common axis. The use of the bands 46 ensures that the cores 34 will be properly maintained in position. This allows the cores 34 to be precisely located, allowing the assembly 10 to properly function as an electromagnetic interference filter while allowing the overall size of the assembly 10 to be reduced when compared to known electromagnetic filter assemblies.

With respect to the cores 38, the bands 46 bend as they are tightened. A tool (not shown) cooperates with a fastener 58 to cause the bands 46 to tighten around the cores 38. The bands 46 are tightened until the bands 46 provide sufficient force to hold the cores 38 in position relative to the tabs 36 and the top surface 33. The controlled tightening of the bands 46 prevents the deformation of the mounting plate 30.

As the cores 34 and 38 are mechanically retained in position by the tabs 32, 36, the bands 46, and the cores 34 and 38 do not require the use of any type of potting compound to secure the cores 34 and 38 in the assembly 10.

Figure 9:
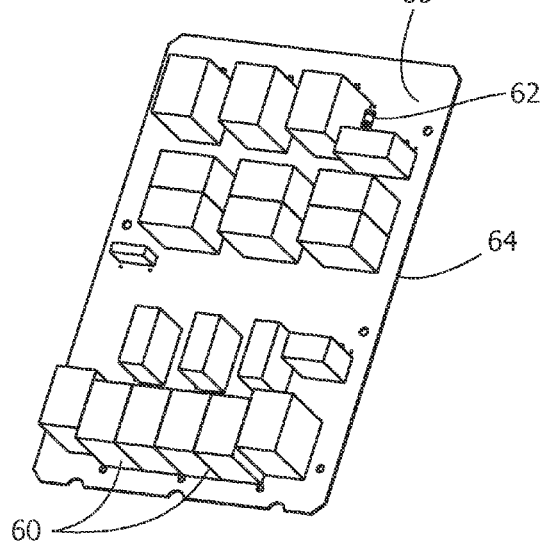
FIG. 9 is a perspective view of a first side of a circuit board used in the filter assembly of FIG. 1, the circuit board having capacitors mounted thereon.
Figure 10:
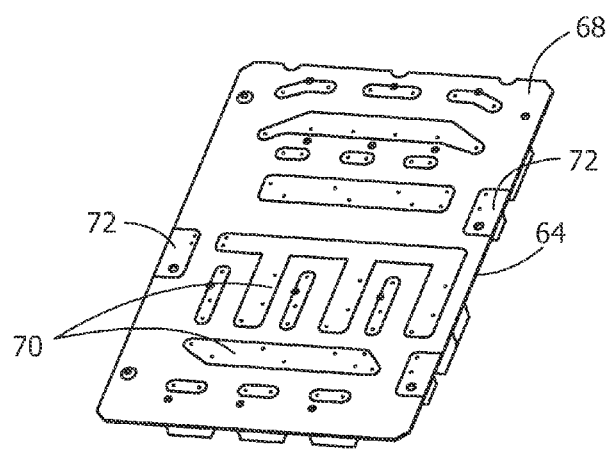
FIG. 10 is a perspective view of a second side of the circuit board of FIG. 9.
Figure 11:
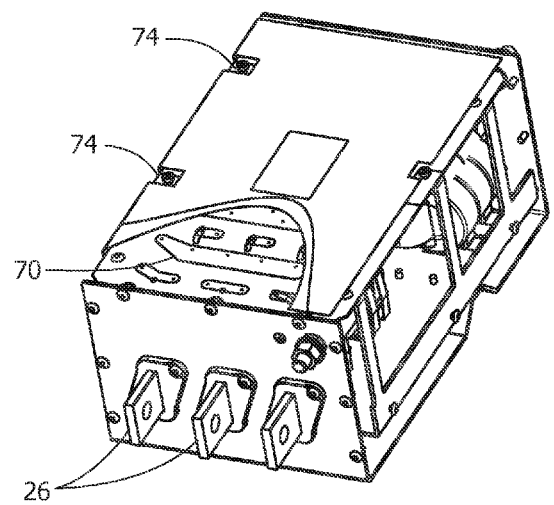
FIG. 11 is a perspective view of the circuit board of FIG. 9 mounted on legs of the plate of FIG. 5.

As shown in FIGS. 9 and 10, a plurality of capacitors 60 and resistors 62 are mounted on a printed circuit board 64. The capacitors 60 and resistors 62 are mounted on a first surface 66 of the circuit board 64 and have leads which extend through the circuit board 64 to a second surface 68. In the embodiment shown, the leads are bent to make contact with traces 70 and are soldered in position to maintain the electrical connection between the leads and the traces 70. Each of the (line-to-line) X-capacitors 60 and resistors 62 has a lead which is connected to a neutral trace, with a (line-to-ground) Y-capacitor connecting between the neutral trace and grounding trace 72 to provide the grounding required for operation.

The circuit board 64 is mounted onto the circuit board mounting tabs 44 of the mounting legs 40 of the mounting plate 30. The circuit board 64 is maintained on the circuit board mounting tabs 44 by screws or other known mounting methods. Conductive members, such as, but not limited to wires 54 are provided in electrical engagement with the traces 70 of the circuit board 64. The wires 54 are soldered in position to maintain the electrical connection between the wires 54 and the traces 70. With the wires 54 and the leads of the capacitors 60 and resistors 62 properly secured to the traces 70, the capacitors 60 and resistors 62 are placed in electrical communication with the bus bars 26.

The capacitors 60 and resistors 62 are precisely located on the circuit board 64, allowing the assembly 10 to properly function as an electromagnetic interference filter while allowing the overall size of the assembly 10 to be reduced when compared to known electromagnetic filter assemblies. In addition, as the capacitors 60 and resistors 62 are mechanically retained in position by the leads and solder, the capacitors 60 and resistors 62 do not require the use of any type of potting compound to secure the capacitors 60 and resistors 62 in the assembly 10.

The assembled mounting plate 30 and circuit board 64 are positioned and secured in the enclosure 12, as shown in FIGS. 1 and 2. Screw receiving openings 74 of the top wall 14 align with the grounding pads 72 of the circuit board 64. Screws are inserted into the openings 74 and the grounding pads 72, thereby placing the enclosure 12 in electrical engagement with the grounding pads 72 of the circuit board 64 to enhance the electromagnetic interference attenuation of the assembly 10. In addition, as the grounding pads 71 are provided in electrical engagement with the electrical components of the filter assembly 10, proper and effective grounding for the components is easily accomplished by attaching the grounding pads 71 to a ground which is external of the filter assembly, thereby enhancing the electromagnetic interference attenuation of the assembly 10.

The mounting plate 30 cooperates with the cores 34 and 38 to dissipate heat generated by the cores 34 and the cores 38. The mounting plate 30 conducts heat to the bottom wall 16 and side walls 18 so that the heat can be efficiently and effectively conducted to the outside of the enclosure 12 of the assembly 10.

Figure 12:
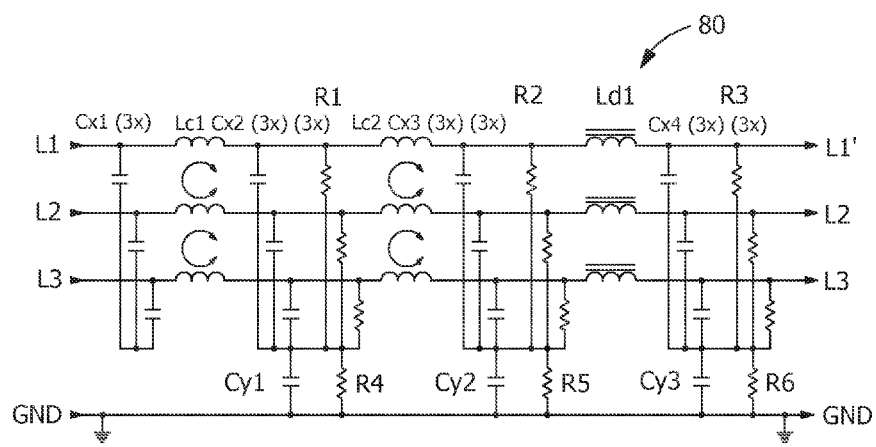
FIG. 12 is a schematic circuit diagram of the circuit formed by the components of the filter assembly.

FIG. 12 is a schematic diagram 80 of the circuit formed by the components of the EMI filter assembly 10 of FIGS. 1 through 11. In FIG. 12: L1, L2 and L3 relates to the bus bars 26; GND relates to the grouding trace 72; R1, R2, R3, R4, R5 and R6 relates to resistors 62; Cy1, Cy2 and Cy3 relates to Y-capacitors; Lc1 and Lc2 relates to inductive cores 34; and Ld1 relates to the inductive cores 38.

The assembly 10 is a multistage assembly for providing electromagnetic interference attenuation in which the electrical components are precisely located and stresses on the electrical components are reduced or eliminated. The assembly 10 is smaller in size and easier to assemble than the filters known in the art.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An assembly for providing electromagnetic interference isolation, the assembly comprising:
an enclosure having a first panel and a second panel;
bus bars extending through the first panel and the second panel;
a mounting plate, the mounting plate having locating members thereon, the mounting plate being positioned between the first panel and the second panel;
a plurality of inductive cores, the plurality of inductive cores being positioned proximate the locating members, the plurality of inductive cores having openings through which the bus bars extend;
capacitors mounted on a circuit board, the capacitors have leads which extend through the circuit board and are provided in electrical engagement with traces of the circuit board;
wherein the plurality of inductive cores and the capacitors are precisely positioned in the enclosure to facilitate an electromagnetic interference attenuation.

2. An assembly for providing electromagnetic interference attenuation, the assembly comprising:
an enclosure having a first panel and a second panel;
bus bars extending through the first panel and the second panel;
a mounting plate, the mounting plate having locating members thereon, the locating members having tabs which extend from a surface of the mounting plate, pairs of tabs form respective cradles into which the inductive cores are positioned, the mounting plate being positioned between the first panel and the second panel;
a plurality of inductive cores, the plurality of inductive cores being positioned proximate the locating members, the plurality of inductive cores having openings through which the bus bars extend;
wherein the plurality of inductive cores are precisely positioned in the enclosure to facilitate an electrical isolation.

3. The assembly of claim 2, wherein padding is provided between the tabs and the plurality of inductive cores, the padding protects the plurality of inductive cores from damage due to hertzian contact stresses.

4. The assembly of claim 2, wherein securing band(s) extend about the plurality of inductive cores and the tabs, the securing bands provide sufficient force to hold the plurality of inductive cores in position in the cradles without deforming the inductive cores, thereby minimizing magnetostriction of the plurality of inductive cores.

5. The assembly of claim 4, wherein the securing bands have a relaxation temperature of greater than 110 degrees Celsius.

6. The assembly of claim 4, wherein the securing bands are a metal tape or metal wire.

7. The assembly of claim 2, comprising:
a circuit board;
capacitors mounted on the circuit board;
conductive members extending between and electrically connecting the circuit board and the bus bars.

8. The assembly of claim 7, wherein the capacitors have leads which extend through the circuit board and are provided in electrical engagement with traces of the circuit board.

9. The assembly of claim 7, wherein grounding traces are provided proximate opposite edges of the circuit board.

10. The assembly of claim 9, wherein the grounding traces of the circuit board are provided in electrical engagement with the enclosure to enhance the electromagnetic interference attenuation of the assembly.

11. An assembly for providing electromagnetic interference isolation, the assembly comprising:
an enclosure having a first panel and a second panel;
bus bars extending through the first panel and the second panel;
a mounting plate, the mounting plate having locating members thereon, the mounting plate being positioned between the first panel and the second panel;
a plurality of inductive cores, the plurality of inductive cores being positioned proximate the locating members, the plurality of inductive cores having openings through which the bus bars extend;
capacitors mounted on a circuit board;
grounding traces of the circuit board provided in electrical engagement with the enclosure;
wherein the plurality of inductive cores and the capacitors are precisely positioned in the enclosure to facilitate an electromagnetic interference attenuation.

12. The assembly of claim 11, wherein tabs extend from a surface of the mounting plate, pairs of tabs form respective cradles into which the plurality of inductive cores are positioned.

13. The assembly of claim 12, wherein securing bands extend about the plurality of inductive cores and the tabs, the securing bands provide a sufficient force to hold the plurality of inductive cores in position in the cradles without deforming the plurality of inductive cores, thereby minimizing magnetostriction of the plurality of inductive cores.

14. The assembly of claim 13, wherein the cradles provides a visual and mechanical indication of the maximum tension to be applied to the securing bands, thereby establishing an appropriate tension limit to allow the securing bands to provide the sufficient force to hold the plurality of inductive cores in position in the cradles without deforming the plurality of inductive cores.

15. The assembly of claim 14, wherein the tabs of the cradles are deflected to properly maintain the plurality of inductive cores in position in the cradles without deforming the inductive cores.

16. A method of providing electromagnetic interference attenuation, the method comprising:
    providing an enclosure assembly;
    providing locating members on a mounting plate housed in the enclosure assembly;
    precisely locating inductive cores on the mounting plate;
    securing the inductive cores on the mounting plate;
    providing a circuit board;
    grounding the circuit board to a shell of the enclosure assembly;
    wherein the inductive cores are precisely positioned in the enclosure to facilitate the electromagnetic interference attenuation.

17. The method of claim 16 comprising:
    dissipating heat generated by the bus bars and the inductive cores through the mounting plate.

18. The method of claim 16 comprising:
    mounting capacitors on the circuit board; and
    electrically connecting conductive members between the circuit board and bus bars which extend through an opening of the inductive cores.

* * * * *